(12) United States Patent
Takeya et al.

(10) Patent No.: US 12,155,020 B2
(45) Date of Patent: Nov. 26, 2024

(54) DISPLAY APPARATUS AND METHOD OF MANUFACTURING THE SAME

(71) Applicant: Seoul Semiconductor Co., Ltd., Ansan-si (KR)

(72) Inventors: Motonobu Takeya, Ansan-si (KR); Jong Ik Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 855 days.

(21) Appl. No.: 17/019,329

(22) Filed: Sep. 13, 2020

(65) Prior Publication Data

US 2020/0411085 A1    Dec. 31, 2020

Related U.S. Application Data

(63) Continuation of application No. 16/676,774, filed on Nov. 7, 2019, now Pat. No. 11,217,300, which is a
(Continued)

(51) Int. Cl.
*H01L 33/62* (2010.01)
*G06F 30/30* (2020.01)
(Continued)

(52) U.S. Cl.
CPC .............. *H01L 33/62* (2013.01); *G06F 30/30* (2020.01); *G06F 30/39* (2020.01); *G11C 8/16* (2013.01); *G11C 11/412* (2013.01); *G11C 11/417* (2013.01); *G11C 11/419* (2013.01); *H01L 25/0753* (2013.01); *H01L 33/0093* (2020.05);
(Continued)

(58) Field of Classification Search
CPC . H01L 33/62; H01L 25/0753; H01L 33/0093; H01L 33/382; H01L 33/52; H01L 33/54; H01L 33/06; H01L 33/32; H01L 33/44; H01L 2933/0016; H01L 2933/0025; H01L 2933/005; H01L 2933/0066; G06F 30/30; G06F 30/39; G11C 8/16;
(Continued)

(56) References Cited

U.S. PATENT DOCUMENTS 10,396,237 B2    8/2019   Wang
10,468,554 B2    11/2019  Han
(Continued)

OTHER PUBLICATIONS

Notice of Allowance mailed Apr. 16, 2021, in U.S. Appl. No. 16/676,774.
(Continued)

*Primary Examiner* — Nha T Nguyen
(74) *Attorney, Agent, or Firm* — Oblon, McClelland, Maier & Neustadt, L.L.P.

(57) ABSTRACT

A display apparatus and a method of manufacturing the same are disclosed. The display apparatus includes at least one light emitting diode chip, a conductive portion disposed under the light emitting diode chip and coupled to the light emitting diode chip, and an insulating material surrounding the conductive portion. The conductive portion includes a first conductive portion and a second conductive portion, and the insulating material is formed to expose at least a portion of the upper surfaces of the first conductive portion and the second conductive portion.

1 Claim, 5 Drawing Sheets

Related U.S. Application Data continuation of application No. 15/935,529, filed on Mar. 26, 2018, now Pat. No. 10,497,845.

(60) Provisional application No. 62/477,021, filed on Mar. 27, 2017.

(51) Int. Cl.

| | | |
|---|---|---|
| *G06F 30/39* | (2020.01) | |
| *G11C 8/16* | (2006.01) | |
| *G11C 11/412* | (2006.01) | |
| *G11C 11/417* | (2006.01) | |
| *G11C 11/419* | (2006.01) | |
| *H01L 25/075* | (2006.01) | |
| *H01L 33/00* | (2010.01) | |
| *H01L 33/38* | (2010.01) | |
| *H01L 33/52* | (2010.01) | |
| *H01L 33/54* | (2010.01) | |
| *H10B 10/00* | (2023.01) | |
| *H01L 33/06* | (2010.01) | |
| *H01L 33/32* | (2010.01) | |
| *H01L 33/44* | (2010.01) | |

(52) U.S. Cl.
CPC ............ *H01L 33/382* (2013.01); *H01L 33/52* (2013.01); *H01L 33/54* (2013.01); *H10B 10/00* (2023.02); *H01L 33/06* (2013.01); *H01L 33/32* (2013.01); *H01L 33/44* (2013.01); *H01L 2933/0016* (2013.01); *H01L 2933/0025* (2013.01); *H01L 2933/005* (2013.01); *H01L 2933/0066* (2013.01)

(58) Field of Classification Search
CPC ... G11C 11/412; G11C 11/417; G11C 11/419; H10B 10/00
See application file for complete search history.

(56) References Cited

U.S. PATENT DOCUMENTS

| | | |
|---|---|---|
| 10,910,350 B2 | 2/2021 | Chu |
| 2010/0109025 A1 | 5/2010 | Bhat |
| 2012/0299038 A1* | 11/2012 | Hwang ................. H01L 33/641 |
| | | 257/E33.062 |
| 2013/0026518 A1 | 1/2013 | Suh |
| 2013/0119424 A1 | 5/2013 | Kang |
| 2013/0240922 A1 | 9/2013 | Yamamoto |
| 2016/0240732 A1 | 8/2016 | Huang et al. |
| 2016/0247982 A1 | 8/2016 | Ting et al. |
| 2017/0025399 A1 | 1/2017 | Takeya et al. |
| 2017/0338199 A1* | 11/2017 | Zou ......................... H01L 24/83 |

OTHER PUBLICATIONS

Final Office Action mailed Oct. 23, 2020, in U.S. Appl. No. 16/676,774.

Non-Final Office Action issued on Jan. 25, 2019, in U.S. Appl. No. 15/935,529.

Notice of Allowance issued on Aug. 9, 2019, in U.S. Appl. No. 15/935,529.

Non-Final Office Action issued on Jun. 9, 2020, in U.S. Appl. No. 16/676,774.

* cited by examiner

DISPLAY APPARATUS AND METHOD OF MANUFACTURING THE SAME

CROSS REFERENCE TO RELATED APPLICATION

This application is a Continuation of U.S. patent application Ser. No. 16/676,774, filed on Nov. 7, 2019, which is a continuation of U.S. patent application Ser. No. 15/935,529, filed Mar. 26, 2018, and claims priority to and the benefit of U.S. Provisional Patent Application No. 62/477,021, filed on Mar. 27, 2017, each of which is hereby incorporated by reference for all purposes as if fully set forth herein.

BACKGROUND

Field

Exemplary embodiments of the invention relate generally to a display apparatus and a method of manufacturing the same. More specifically, exemplary embodiments relate to a display apparatus employing light emitting diode chips and a method of manufacturing the same.

Discussion of the Background

A light emitting diode refers to an inorganic semiconductor device that emits light through recombination of electrons and holes. In recent years, light emitting diodes have been used in various fields including displays, automobile lamps, general lighting, and the like. Light emitting diodes have various advantages such as long lifespan, low power consumption, and rapid response. With such advantages, a light emitting diode replaces existing light sources in the related art.

Recently, display apparatuses, such as TVs, monitors and electronic display boards, realize colors through a thin film transistor liquid crystal display (TFT-LCD) panel, and employ light emitting diodes as a light source of a backlight unit. In addition, various studies have been conducted to develop a display apparatus capable of realizing colors directly through light emitting diodes instead of using a separate LCD with light emitting diodes as a backlight source.

In order to use light emitting diodes as a light source of a backlight unit or for direct realization of colors, one light emitting diode may be provided to each pixel. Here, in order to control each of the light emitting diodes, an active matrix (AM) drive type or a passive matrix (PM) drive type may be employed. For the AM drive type, the luminous area of each light emitting diode is $1/10,000$ of the area of one pixel, and for the PM drive type, the luminous area of each light emitting diode is $1/100$ of the area of one pixel.

However, light emitting diodes having an excessively large luminous area provide a problem of low current density, causing deterioration in luminous efficacy. Accordingly, light emitting diodes having a small luminous area as compared with the area of a pixel are used to increase current density while satisfying luminous efficacy in a pixel.

However, since the size of the light emitting diode decreases corresponding to decrease in luminous area, light emitting diodes having a small luminous area provide difficulty in mounting and replacement of a number of light emitting diodes due to a their small size.

The above information disclosed in this Background section is only for understanding of the background of the inventive concepts, and, therefore, it may contain information that does not constitute prior art.

SUMMARY

Devices constructed according to exemplary embodiments of the invention include a light emitting diode chip capable of having a high current density, despite a small amount of current being supplied to the light emitting diode chip through reduction in luminous area. In addition, devices constructed according to exemplary embodiments of the invention are capable of improving the manufacturing yield and replacement of the parts of the display apparatus because the devices have large light emitting diode packages compared to the light emitting diode chips. Furthermore, methods according to exemplary embodiments of the invention are capable of minimizing failure in the transfer of the light emitting diode chips by transferring of only some light emitting diode chips from one surface to the substrate electrodes on a substrate via electrode enlarging portions.

Additional features of the inventive concepts will be set forth in the description which follows, and in part will be apparent from the description, or may be learned by practice of the inventive concepts.

In accordance with one exemplary embodiment of the present invention, a display apparatus includes: a light emitting diode chip; and a first substrate electrode and a second substrate electrode disposed under the light emitting diode chip and electrically connected to the light emitting diode chip, the first substrate electrode and the second substrate electrode are electrically insulated from each other, wherein at least a portion of at least one of the first substrate electrode and the second substrate electrode protrudes above its surroundings.

The at least the portion of the at least one of the first substrate electrode and the second substrate electrode protruding above the surroundings may be provided with a filler including an insulating material therein.

The display apparatus may further include a substrate supporting the light emitting diode chip, wherein the first substrate electrode and the second substrate electrode are disposed on the substrate.

The light emitting diode chip may include: a light emitting structure including a first conductivity type semiconductor layer, a second conductivity type semiconductor layer, and an active layer interposed between the first conductivity type semiconductor layer and the second conductivity type semiconductor layer; and a first electrode electrically connected to the first conductivity type semiconductor layer.

The light emitting diode chip may further include a second electrode electrically connected to the second conductivity type semiconductor layer, wherein the first electrode is electrically connected to the first conductivity type semiconductor layer exposed by the removal of the active layer and the second conductivity type semiconductor layer.

The light emitting diode chip may further include: an encapsulation material disposed to cover the light emitting structure and the first electrode and the second electrode while insulating the first electrode and the second electrode from each other; a first bump electrically connected to the first electrode; and a second bump electrically connected to the second electrode, wherein the first bump and the second bump are electrically connected to the first electrode and the second electrode, respectively, through the encapsulation material.

The display apparatus may further include a connection electrode electrically connecting the second conductivity type semiconductor layer to the second substrate electrode, wherein the first electrode is disposed under the light emitting structure and is electrically connected to the first substrate electrode.

The display apparatus may further include an insulating portion filling a space between the first substrate electrode and the second substrate electrode and surrounding a side surface of the light emitting structure, wherein the connection electrode is disposed along an upper surface and a side surface of the insulating portion.

In accordance with another exemplary embodiment of the present invention, a display apparatus includes: a light emitting diode chip; and a first substrate electrode and a second substrate electrode disposed under the light emitting diode chip and electrically connected to the light emitting diode chip, the first substrate electrode and the second substrate electrode being electrically insulated from each other; and a first electrode-enlarging portion and a second electrode-enlarging portion disposed on the first substrate electrode and the second substrate electrode, respectively, and electrically connecting the light emitting diode chip to the first substrate electrode and the second substrate electrode.

The display apparatus may further include a substrate supporting the light emitting diode chip, wherein the first substrate electrode and the second substrate electrode are disposed on the substrate.

In accordance with another exemplary embodiment of the present invention, a method of manufacturing a display apparatus includes: disposing a first manufacturing substrate and a substrate to face each other, the first manufacturing substrate having a plurality of light emitting diode chips arranged thereon, the substrate having first substrate electrodes and second substrate electrodes disposed on the substrate; moving the first manufacturing substrate toward the substrate such that the some of the plurality of light emitting diode chips are brought into contact with the first substrate electrodes and second substrate electrodes; and separating the first manufacturing substrate from the plurality of light emitting diode chips brought into contact with and coupled to the first substrate electrodes and the second substrate electrodes, wherein at least one of the first substrate electrodes and the second substrate electrodes at least partially protrudes above the substrate so as to prevent the remaining light emitting diode chips not brought into contact with the first substrate electrodes and the second substrate electrodes from contacting the substrate and the first substrate electrodes and the second substrate electrodes.

The portion of the at least one of the first substrate electrode and the second substrate electrode protruding above the surroundings may be provided with a filler including an insulating material therein.

Each light emitting diode chip may include: a light emitting structure including a first conductivity type semiconductor layer, a second conductivity type semiconductor layer, and an active layer interposed between the first and second conductivity type semiconductor layers; a first electrode electrically connected to the first conductivity type semiconductor layer exposed by removing the active layer and the second conductivity type semiconductor layer; a second electrode electrically connected to the second conductivity type semiconductor layer; an encapsulation material disposed to cover the light emitting structure and the first electrode and the second electrode while insulating the first electrode and the second electrode from each other; a first bump electrically connected to the first electrode; and a second bump electrically connected to the second electrode, wherein the first bump and the second bump are electrically connected to the first electrode and the second electrode, respectively, through the encapsulation material.

Each light emitting diode chip may include: a light emitting structure including a first conductivity type semiconductor layer, a second conductivity type semiconductor layer, and an active layer interposed between the first and second conductivity type semiconductor layers; and a second electrode electrically connected to the second conductivity type semiconductor layer, wherein the second electrode is electrically coupled to the second substrate electrode.

The method may further include: forming an insulating portion to fill a space between a first substrate electrode of the first substrate electrode and a second substrate electrode of the second substrate electrode while surrounding a side surface of the light emitting structure; and forming a connection electrode electrically connected to the first conductivity type semiconductor layer exposed on an upper surface of the insulating portion and electrically connected to the first substrate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
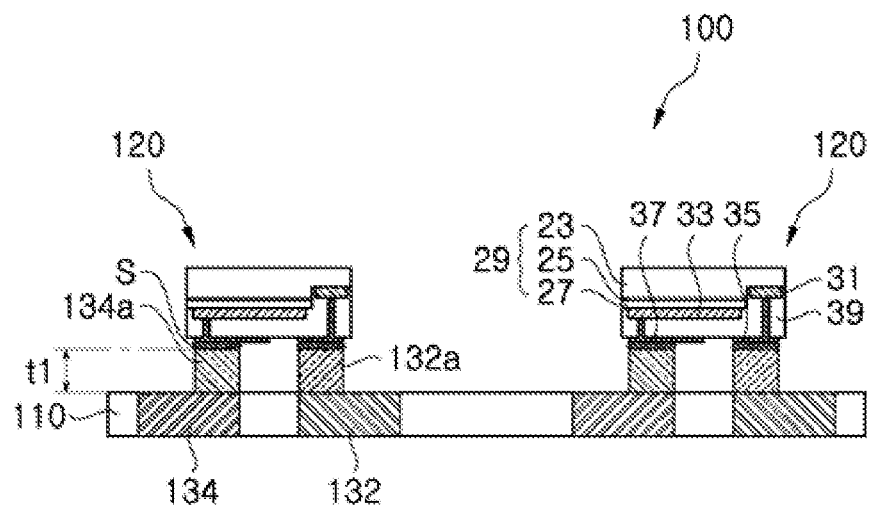
FIG. 1 is a sectional view of part of a display apparatus according to a first exemplary embodiment of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a sectional view of part of a display apparatus according to a first exemplary embodiment of the present invention.

Referring to FIG. 1, the display apparatus 100 according to the first exemplary embodiment includes a substrate 110, light emitting diode chips 120, first substrate electrodes 132, second substrate electrodes 134, first electrode-enlarging portions 132a, and second electrode-enlarging portions 134a.

The substrate 110 serves to support the light emitting diode chips 120. In this exemplary embodiment, the substrate 110 may be formed of an insulating material and have a predetermined thickness.

The light emitting diode chips 120 are arranged on the substrate 110 and may emit light upon receiving power from an external power source. As shown in FIG. 1, each of the light emitting diode chips 120 includes a light emitting structure 29, an n-type electrode 31, a p-type electrode 33, an n-type bump 35, a p-type bump 37, and an encapsulation portion 39. The light emitting structure 29 may include an n-type semiconductor layer 23, an active layer 25, and a p-type semiconductor layer 27.

Each of the n-type semiconductor layer 23, the active layer 25 and the p-type semiconductor layer 27 may include Group III-V based compound semiconductors. By way of example, the n-type semiconductor layer 23, the active layer 25 and the p-type semiconductor layer 27 may include nitride semiconductors such as (Al, Ga, In)N. The position of the n-type semiconductor layer 23 may be interchanged with the position of the p-type semiconductor layer 27.

The n-type semiconductor layer 23 may be a conductive semiconductor layer containing n-type dopants (for example, Si) and the p-type semiconductor layer 27 may be a conductive semiconductor layer containing p-type dopants (for example, Mg). The active layer 25 is interposed between the n-type semiconductor layer 23 and the p-type semiconductor layer 27, and may include a multi-quantum well (MQW) structure. The composition of the active layer 25 may be determined to emit light having a desired peak wavelength. In this exemplary embodiment, the composition of the active layer 25 may be determined such that the light emitting diode chip 120 can emit light having a peak wavelength in a desired wavelength band. By way of example, the light emitting structure 29 may include an AlInGaN-based semiconductor.

Referring to FIG. 1, in the light emitting structure 29, the n-type semiconductor layer 23 and the active layer 25 are sequentially stacked on the p-type semiconductor layer 27 in the stated order. In addition, the n-type semiconductor layer 23 may be partially exposed by partially removing the p-type semiconductor layer 27 and the active layer 25.

The n-type electrode 31 is disposed in an exposed region of a lower surface of the n-type semiconductor layer 23 to be electrically connected to the n-type semiconductor layer 23, and the p-type electrode 33 is disposed on a lower surface of the p-type semiconductor layer 27 to be electrically connected to the p-type semiconductor layer 27. That is, in this exemplary embodiment, the light emitting diode chip 120 may have a horizontal structure in which the n-type electrode 31 and the p-type electrode 33 are arranged in the same direction.

The encapsulation portion 39 may be disposed on a lower surface of the light emitting structure 29 to cover the n-type electrode 31, the p-type electrode 33 and the light emitting structure 29. The encapsulation portion 39 exhibits electrically insulating properties and can protect the light emitting structure 29, the n-type electrode 31 and the p-type electrode 33 from external environments. In this exemplary embodiment, the encapsulation portion 39 may be formed of a transparent material. Alternatively, the encapsulation portion 39 may be formed of an opaque material or a translucent material, as needed. Here, the encapsulation portion 39 may have the same width as the light emitting structure 29.

The n-type bump 35 and the p-type bump 37 may be disposed to cover a portion of a lower surface of the encapsulation portion 39 and may be electrically connected to the n-type electrode 31 and the p-type electrode 33 through via-holes formed in the encapsulation portion 39, respectively. The n-type bump 35 and the p-type bump 37 are spaced apart from each other on the lower surface of the encapsulation portion 39 to be electrically insulated from each other.

The first substrate electrodes 132 and the second substrate electrodes 134 are provided to the substrate 110. Each of the first substrate electrodes 132 extends from an upper surface of the substrate 110 to a lower surface thereof through the substrate 110 to be exposed on the upper and lower surfaces of the substrate 110. Like the first substrate electrodes 132, each of the second substrate electrodes 134 extends from the upper surface of the substrate 110 to the lower surface thereof through the substrate 110 to be exposed on the upper and lower surfaces of the substrate 110. That is, according to this exemplary embodiment, the first substrate electrodes 132 and the second substrate electrodes 134 are regularly arranged on the substrate 110 formed of an insulating material. For example, the first substrate electrodes 132 and the second substrate electrodes 134 are regularly arranged within the substrate 110.

The first electrode-enlarging portion 132a and the second electrode-enlarging portion 134a may be disposed on the first substrate electrode 132 and the second substrate electrode 134, respectively. The first electrode-enlarging portion 132a may be disposed on the first substrate electrode 132 to be electrically connected to the first substrate electrode 132 and may have a predetermined thickness t1. In addition, the second electrode-enlarging portion 134a may be disposed on the second substrate electrode 134 to be electrically connected to the second substrate electrode 134 and may have a predetermined thickness t1. With this structure, upper surfaces of the first electrode-enlarging portion 132a and the second electrode-enlarging portion 134a are placed above upper surfaces of the first substrate electrode 132 and the second substrate electrode 134.

The first electrode-enlarging portion 132a and the second electrode-enlarging portion 134a have smaller widths than the first substrate electrode 132 and the second substrate electrode 134, respectively. Further, as illustrated in FIG. 1, the opposed outer edges of the first substrate electrode 132 and the second substrate electrode 134 extend beyond the width of the light emitting diode chip 120.

Each of the light emitting diode chips 120 may be disposed on the first electrode-enlarging portion 132a and the second electrode-enlarging portion 134a. That is, the n-type bump 35 and the p-type bump 37 of the light emitting diode chip 120 may be electrically connected to the first electrode-enlarging portion 132a and the second electrode-enlarging portion 134a, respectively. To this end, a bonding portion S may be deposited on each of the first electrode-enlarging portion 132a and the second electrode-enlarging portion 134a.

In addition, as shown in the drawings, the first electrode-enlarging portion 132a and the second electrode-enlarging portion 134a may have the same thickness t1 and serve to separate the light emitting diode chip 120 from the upper surface of the substrate 110 by a predetermined distance or more. Here, the thickness t1 of each of the first electrode-enlarging portion 132a and the second electrode-enlarging portion 134a may be smaller than the thickness of the light emitting diode chip 120 and greater than the thickness of the bonding portion S. By way of example, the first electrode-enlarging portion 132a and the second electrode-enlarging portion 134a may have a thickness t1 of 0.2 μm to 5 μm.

Further, the first electrode-enlarging portion 132a and the second electrode-enlarging portion 134a may be formed of the same material as the first substrate electrode 132 and the second substrate electrode 134 and may include an electrically conductive material. That is, the first electrode-enlarging portion 132a and the second electrode-enlarging portion 134a may include a metal.

Figure 2A:
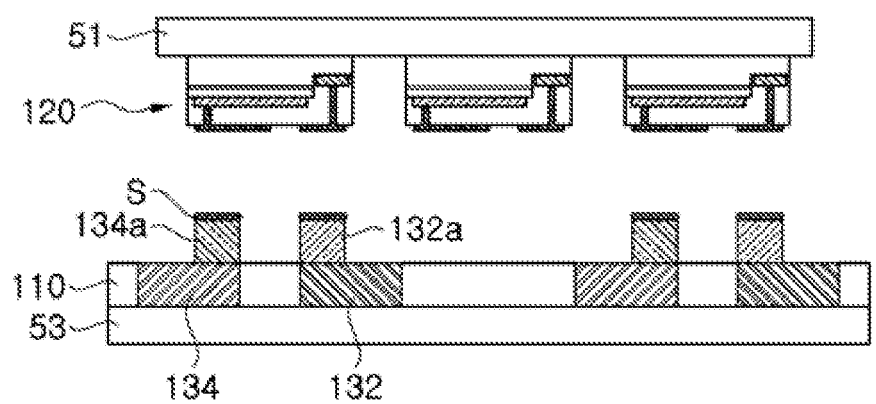
FIG. 2A, FIG. 2B, and FIG. 2C show sectional views illustrating a method of manufacturing the display apparatus according to the first exemplary embodiment of the present invention.
Figure 2B:
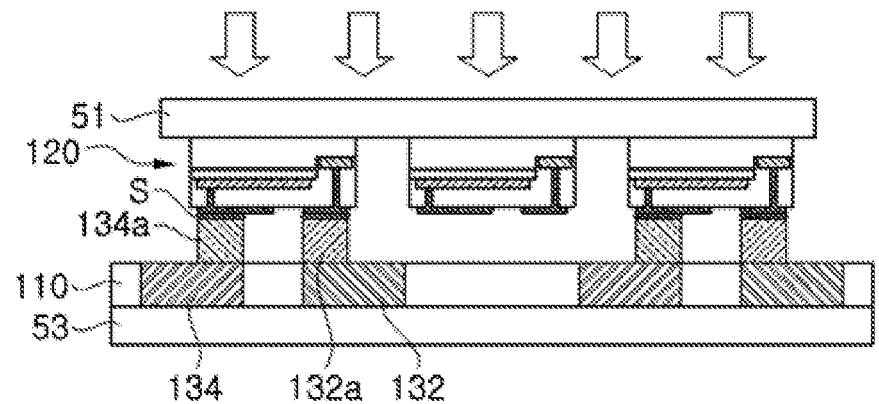
Figure 2C:
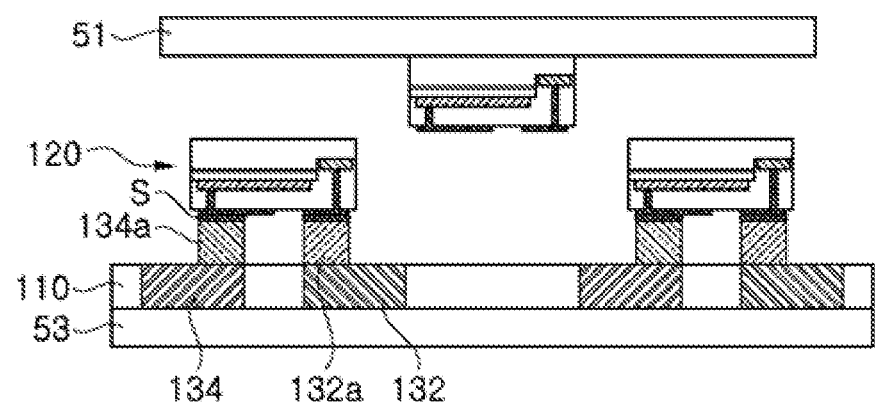

FIG. 2A, FIG. 2B, and FIG. 2C shows sectional views illustrating a method of manufacturing the display apparatus according to the first exemplary embodiment of the present invention.

Referring to FIGS. 2A, 2B, and 2C, the method of manufacturing the display apparatus 100 according to the first exemplary embodiment will be described.

Referring to FIG. 2A, a plurality of light emitting diode chips 120 are coupled to a first manufacturing substrate 51. The first substrate electrodes 132 and the second substrate electrodes 134 are arranged on the substrate 110. For example, the first substrate electrodes 132 and the second substrate electrodes 134 are arranged within the substrate 110 In addition, a first electrode-enlarging portion 132a and a second electrode-enlarging portion 134a may be disposed on the first substrate electrode 132 and the second substrate electrode 134, respectively.

That is, as shown in FIG. 2A, two pairs of first substrate electrodes 132 and second substrate electrodes 134 are arranged on the substrate 110 and three light emitting diode chips 120 are coupled to the first manufacturing substrate 51. In this state, the first manufacturing substrate 51 is moved to the substrate 110 such that n-type bumps 35 and p-type bumps 37 of the light emitting diode chips 120 are brought into contact with the first electrode-enlarging portions 132a and the second electrode-enlarging portions 134a. Then, the light emitting diode chips 120 may be compressed downwards to be bonded to the first electrode-enlarging portions 132a and the second electrode-enlarging portions 134a.

Here, among the plurality of light emitting diode chips 120 coupled to the first manufacturing substrate 51, a light emitting diode chip 120 not contacting the first electrode-enlarging portion 132a and the second electrode-enlarging portion 134a does not contact any region of the substrate 110 due to the thicknesses of the first electrode-enlarging portion 132a and the second electrode-enlarging portion 134a. That is, the light emitting diode chip 120 not contacting the first electrode-enlarging portion 132a and the second electrode-enlarging portion 134a does not contact any region of the substrate 110 and is disposed in the air.

Next, as shown in FIG. 2C, when the first manufacturing substrate 51 is moved upward, the light emitting diode chips 120 bonded to the first electrode-enlarging portions 132a and the second electrode-enlarging portions 134a remain on the substrate 110, and the light emitting diode chip 120 disposed in the air is moved together with the first manufacturing substrate 51.

In this way, some of the plurality of light emitting diode chips 120 coupled to the first manufacturing substrate 51 can be transferred to the substrate 110. Here, since the first electrode-enlarging portions 132a and the second electrode-enlarging portions 134a are disposed on the first substrate electrodes 132 and the second substrate electrodes 134, some of the plural light emitting diode chips 120 coupled to the first manufacturing substrate 51 can be transferred to the substrate 110 due to the thickness t1 of the first and second electrode-enlarging portions 132a, 134a.

Figure 3:
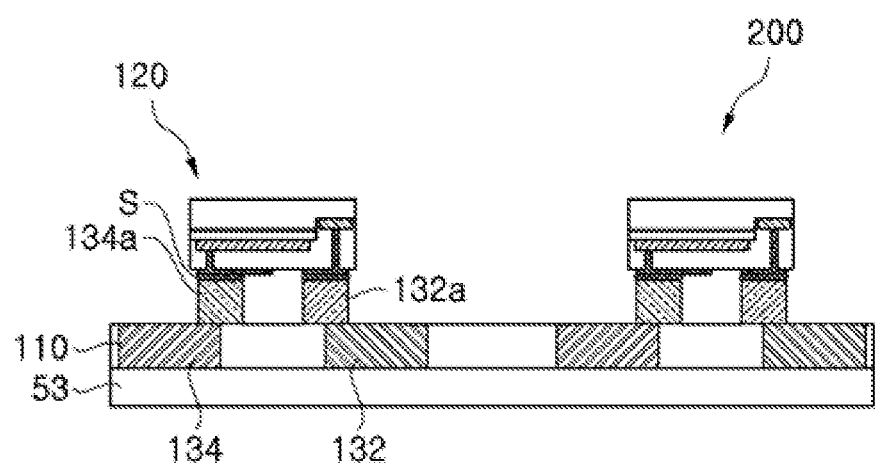
FIG. 3 is a sectional view of part of a display apparatus according to a second exemplary embodiment of the present invention.

FIG. 3 is a sectional view of part of a display apparatus according to a second exemplary embodiment of the present invention.

Referring to FIG. 3, the display apparatus 200 according to the second exemplary embodiment includes a substrate 110, light emitting diode chips 120, first substrate electrodes 132, second substrate electrodes 134, first electrode-enlarging portions 132a, and second electrode-enlarging portions 134a. In description of the display apparatus 200 according to this exemplary embodiment, description of the same components as those of the first exemplary embodiment will be omitted.

In this exemplary embodiment, the first substrate electrodes 132 and the second substrate electrodes 134 are arranged on (such as within) the substrate 110 such that a distance between the first substrate electrode 132 and the second substrate electrode 134 is larger than the distance between the first substrate electrode 132 and the second substrate electrode 134 according to the first exemplary embodiment. In addition, the first electrode-enlarging portions 132a and the second electrode-enlarging portions 134a are disposed on an upper surface of the substrate 110. Here, the first electrode-enlarging portion 132a is disposed to electrically contact at least a portion of the first substrate electrode 132 and the second electrode-enlarging portions 134a is disposed to electrically contact at least a portion of the second substrate electrode 134.

That is, the first electrode-enlarging portion 132a and the second electrode-enlarging portion 134a may be disposed on the first substrate electrode 132 and the second substrate electrode 134 to be placed in some regions thereof and electrically connected thereto, respectively. Here, the first electrode-enlarging portion 132a and the second electrode-enlarging portion 134a may be arranged corresponding to the distance between the n-type bump 35 and the p-type bump 37 of each of the light emitting diode chips 120.

Figure 4:
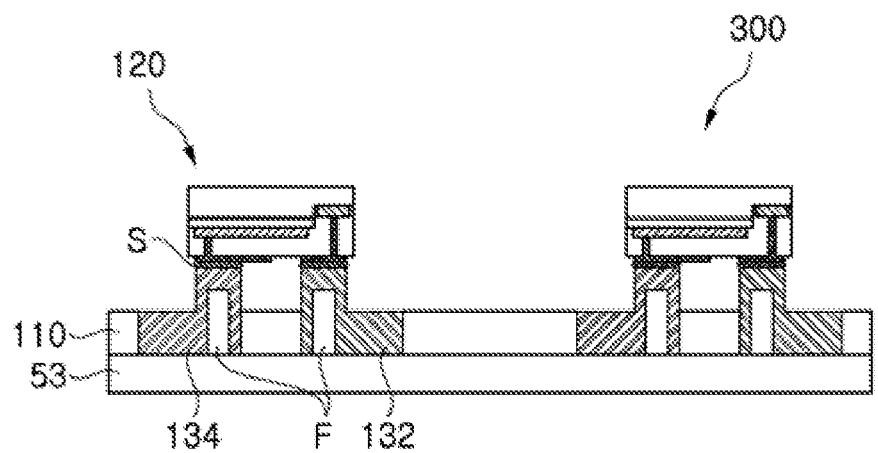
FIG. 4 is a sectional view of part of a display apparatus according to a third exemplary embodiment of the present invention.

FIG. 4 is a sectional view of part of a display apparatus according to a third exemplary embodiment of the present invention.

Referring to FIG. 4, the display apparatus 300 according to the third exemplary embodiment includes a substrate 110, light emitting diode chips 120, first substrate electrodes 132, second substrate electrodes 134, and fillers F. In description of the display apparatus 300 according to this exemplary embodiment, description of the same components as those of the first exemplary embodiment will be omitted.

The first substrate electrodes 132 and the second substrate electrodes 134 are arranged on the substrate 110. For example, the first substrate electrodes 132 and the second substrate electrodes 134 are arranged within the substrate 110. In this exemplary embodiment, a portion of the first substrate electrode 132 may protrude above the substrate 110 by a predetermined thickness. With this structure, an upper surface of the first substrate electrode 132 is placed above the upper surface of the substrate 110, as shown in FIG. 3. The filler F may be disposed in the protrusion of the first substrate electrode 132. The filler F may be disposed in the protrusion of the first substrate electrode 132 and may be formed of an insulating material.

In addition, a portion of the second substrate electrode 134 may protrude above the substrate 110 by a predetermined thickness. Here, the second substrate electrode 134 may have a symmetrical shape with respect to the first substrate electrode 132 or may have the same shape as the first substrate electrode 132, as needed.

Although the fillers F are disposed in the first substrate electrode 132 and the second substrate electrode 134 in this exemplary embodiment, the fillers F may be omitted, as needed.

Figure 5:
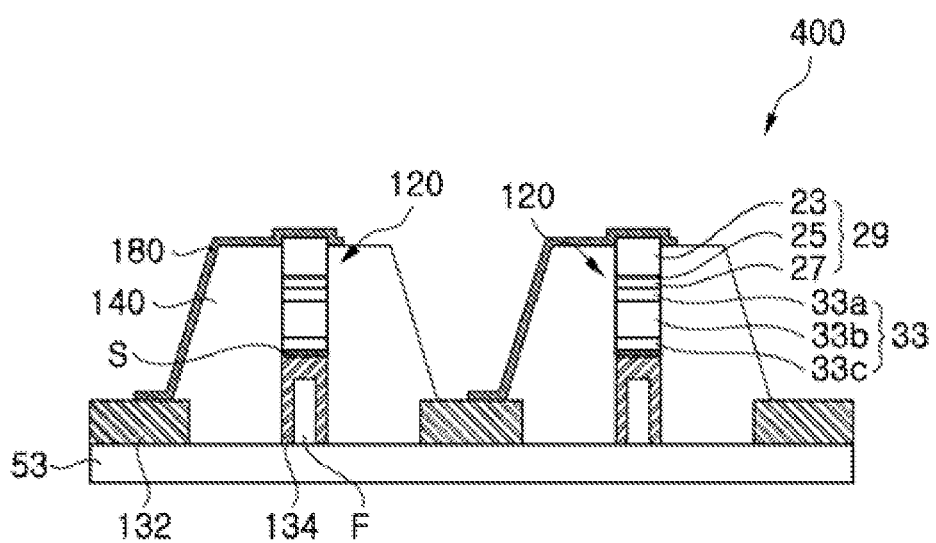
FIG. 5 is a sectional view of part of a display apparatus according to a fourth exemplary embodiment of the present invention.

FIG. 5 is a sectional view of part of a display apparatus according to a fourth exemplary embodiment of the present invention.

Referring to FIG. 5, the display apparatus 400 according to the fourth exemplary embodiment includes light emitting diode chips 120, first substrate electrodes 132, second substrate electrodes 134, insulating portions 140, and connection electrodes 180.

In this exemplary embodiment, the first substrate electrodes 132 and the second substrate electrodes 134 are disposed on a second manufacturing substrate 53. However, it should be understood that the present invention is not limited thereto. After manufacture of the display apparatus 400, the second manufacturing substrate 53 may be removed from the display apparatus 400, as needed.

The first substrate electrodes 132 and the second substrate electrodes 134 are regularly arranged on the second manufacturing substrate 53. Specifically, pairs of first substrate electrodes 132 and second substrate electrodes 134 are regularly arranged on the second manufacturing substrate 53, in which the first substrate electrode 132 and the second substrate electrode 134 are separated a predetermined distance from each other.

Here, each of the first substrate electrode 132 and the second substrate electrode 134 has a predetermined thickness and the thickness of the second substrate electrode 134 may be thicker than the first substrate electrode 132. Further, the second substrate electrode 134 may have a smaller width than the first substrate electrode 132 and the thickness of the second substrate electrode 134 may correspond to the width of the light emitting diode chip 120, without being limited thereto.

According to this exemplary embodiment, the second substrate electrode 134 may include a filler F therein. As in the third exemplary embodiment, the filler F may include an insulating material and may be disposed in the second substrate electrode 134. Accordingly, the filler F can facilitate formation of the second substrate electrode 134 having a thick thickness.

The light emitting diode chip 120 is disposed on each of the second substrate electrodes 134. In this exemplary embodiment, the light emitting diode chip 120 has a vertical structure in which an n-type semiconductor layer 23, an active layer 25 and a p-type semiconductor layer 27 are sequentially stacked in the stated order. In this exemplary embodiment, the p-type semiconductor layer 27 is disposed at a lower portion of the light emitting diode chip. Further, a p-type electrode 33 may be disposed between the p-type semiconductor layer 27 and the second substrate electrode 134.

The p-type electrode 33 is disposed under the p-type semiconductor layer 27 and includes first to third electrodes 33a, 33b, 33c. The first electrode 33a electrically contacts the p-type semiconductor layer 27 and the second and third electrodes 33b, 33c are sequentially disposed under the first electrode 33a. In this exemplary embodiment, the first electrode 33a may include gold (Au), the second electrode 33b may include aluminum Al, and the third electrode 33c may include silver Ag.

Although the p-type electrode 33 is illustrated as having a multilayer structure including the first to third electrodes 33a, 33b, 33c in this exemplary embodiment, the p-type electrode 33 may have a monolayer structure, as needed, and the p-type electrode 33 may have a thinner thickness than that shown in FIG. 5.

In this exemplary embodiment, the light emitting structure 29 may be disposed on the second substrate electrode 134 and the p-type electrode 33 of the light emitting structure 29 may be electrically connected to the second substrate electrode 134. Specifically, the p-type electrode 33 may be bonded to the second substrate electrode 134 by a bonding portion S.

In this way, the light emitting diode chip 120 may be disposed on the second substrate electrode 134 and the insulating portion 140 may be disposed to surround the light emitting diode chip 120. The insulating portion 140 is disposed to fill a space between the first substrate electrode 132 and the second substrate electrode 134 while partially covering an upper surface of the first substrate electrode 132. Further, the insulating portion 140 may be disposed to surround a side surface of the light emitting diode chip 120 excluding a portion of the n-type semiconductor layer 23 of the light emitting diode chip 120. Accordingly, an upper surface of the n-type semiconductor layer 23 of the light emitting diode chip 120 may be exposed through an upper surface of the insulating portion 140, as shown in FIG. 5. The insulating portion 140 may have a slanted side surface, as shown in FIG. 5, or may have a vertical side surface, as needed. Further, the insulating portion 140 may have a circular or polygonal shape in plan view.

In this exemplary embodiment, the insulating portion 140 may be formed of a transparent material or a translucent material to allow light emitted from the light emitting diode chip 120 to be discharged therethrough. For example, the insulating portion 140 may include at least one of polydimethylsiloxane (PDMS), polyimide, poly(methyl methacrylate) (PMMA), and a ceramic material.

The display apparatus 400 may further include the connection electrode 180, which electrically connects the n-type semiconductor layer 23 exposed through the upper surface of the insulating portion 140 to the first substrate electrode 132. The connection electrode 180 has one side covering an upper surface of the n-type semiconductor layer 23 and extends along the upper surface of the insulating portion 140 to be disposed at the other side thereof on the first substrate electrode 132 in order to electrically connect the n-type semiconductor layer 23 to the first substrate electrode 132. Although the display apparatus according to this exemplary embodiment is illustrated as not including the n-type electrode 31, the display apparatus may include the n-type electrode 31, as needed. Further, the connection electrode 180 may include a transparent material, for example, ITO or ZnO, to allow light emitted from the light emitting diode chip 120 to pass therethrough.

FIG. 6A, FIG. 6B, FIG. 6C, FIG. 6D, and FIG. 6E show sectional views illustrating a method of manufacturing the display apparatus according to the fourth exemplary embodiment of the present invention.

Referring to FIGS. 6A, 6B, 6C, 6D, and 6E, the method of manufacturing the display apparatus 400 according to the fourth exemplary embodiment will be described.

Figure 6A:
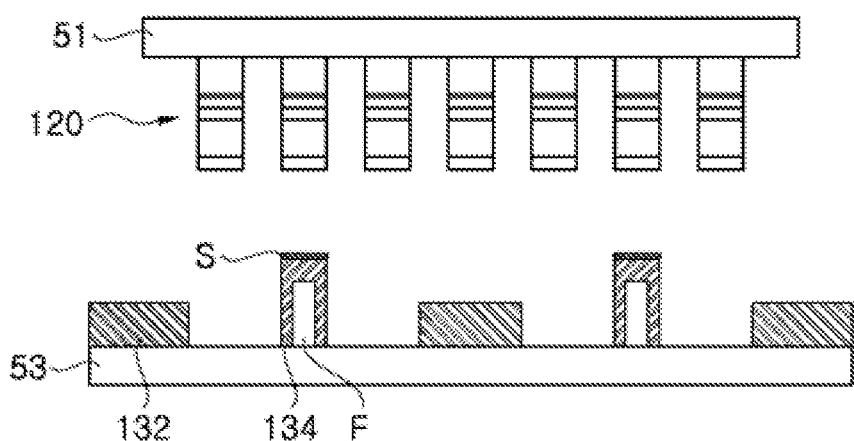
FIG. 6A, FIG. 6B, FIG. 6C, FIG. 6D, and FIG. 6E show sectional views illustrating a method of manufacturing the display apparatus according to the fourth exemplary embodiment of the present invention.

Referring to FIG. 6A, a plurality of light emitting diode chips 120 is disposed on a first manufacturing substrate 51. Here, the plurality of light emitting diode chips 120 coupled to the first manufacturing substrate 51 may have a vertical structure. In addition, first substrate electrodes 132 and second substrate electrodes 134 are regularly arranged at constant intervals on the second manufacturing substrate 53. Here, the second substrate electrodes 134 may have a larger thickness than the first substrate electrodes 132 and a bonding portion S is deposited on each of the second substrate electrodes 134.

Figure 6B:
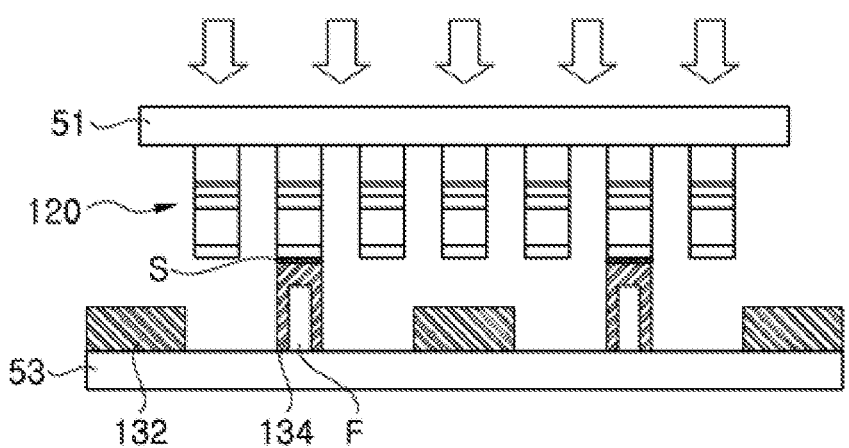

Next, referring to FIG. 6B, the first manufacturing substrate 51 on which the plural light emitting diode chips 120 are disposed is moved toward the second manufacturing substrate 53 such that some of the plurality of light emitting diode chips 120 are bonded to the first substrate electrodes 132. Here, the light emitting diode chips 120 contacting the second substrate electrodes 134 are bonded to the second substrate electrodes 134 by the bonding portion S and the remaining light emitting diode chips 120 are disposed or remain in the air, as shown in FIG. 6. Then, the first manufacturing substrate 51 is compressed downwards to couple the light emitting diode chips 120 to the second substrate electrodes 134.

Figure 6C:
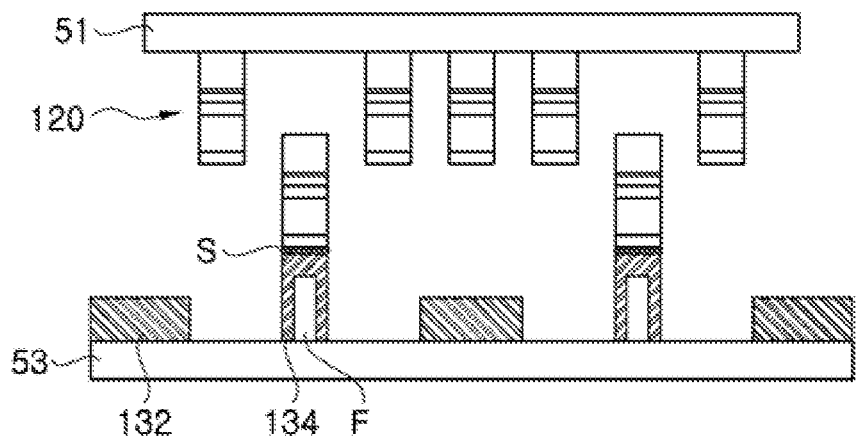

Then, as shown in FIG. 6C, the first manufacturing substrate 51 is moved upwards to be separated from the second manufacturing substrate 53. Then, the light emitting diode chips 120 coupled to the second substrate electrodes 134 are separated from the first manufacturing substrate 51 and are disposed on the second substrate electrodes 134.

In this procedure, since the light emitting diode chips 120 not contacting the second substrate electrodes 134 do not contact other components on the second manufacturing substrate 53 even upon compression of the first manufacturing substrate 51, the light emitting diode chips 120 not contacting the second substrate electrodes 134 may not be separated from the first manufacturing substrate 51.

In this way, some of the plurality of light emitting diode chips 120 disposed on the first manufacturing substrate 51 can be transferred to the second manufacturing substrate 53.

Figure 6D:
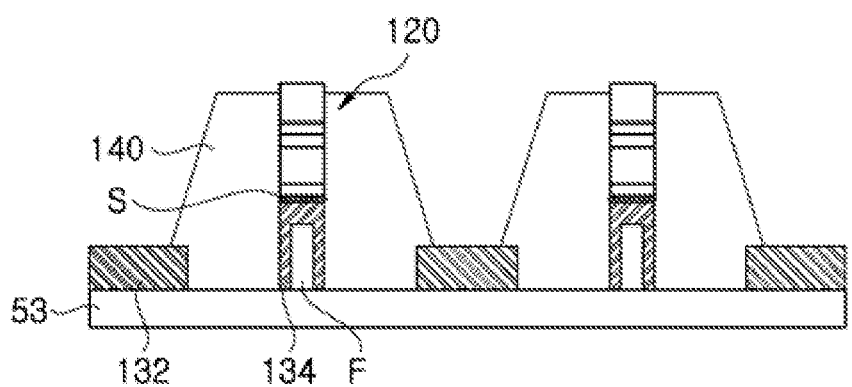

After some of the plurality of light emitting diode chips 120 are transferred to the second manufacturing substrate 53, an insulating portion 140 is formed between the light emitting diode chips 120, as shown in FIG. 6D. The insulating portion 140 is formed to fill a space between the first substrate electrode 132 and the second substrate electrode 134 on the second manufacturing substrate 53 while surrounding each of light emitting diode chip 120 such that the n-type semiconductor layer 23 of the light emitting diode chip 120 can be partially exposed. Here, the insulating portion 140 may be formed to have a slanted side surface.

Figure 6E:
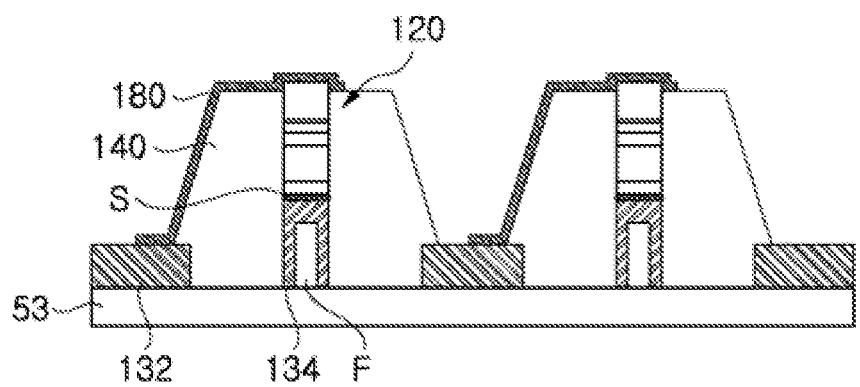

Next, as shown in FIG. 6E, connection electrodes 180 are formed to cover the n-type semiconductor layer 23 exposed on the upper surface of the insulating portion 140 while extending to the first substrate electrodes 132. Each of the connection electrodes 180 may have one side covering the n-type semiconductor layer 23 and may be electrically connected at the other side thereof to the first substrate electrode 132. Further, the connection electrode 180 may extend along the upper and side surfaces of the insulating portion 140 while contacting the insulating portion 140.

According to exemplary embodiments, the light emitting diode chips can have high current density, despite a small amount of current being supplied to the light emitting diode chips through reduction in luminous area.

In addition, upon transfer of some of plurality of light emitting diode chips from a first substrate to a second substrate, only the light emitting diode chips to be transferred are brought into contact with substrate electrodes of the second substrate with or without the assistance of an electrode-enlarging portion. As a result, it is possible to minimize failure in transfer of the light emitting diode chips.

Furthermore, even with light emitting diode chips each having a small luminous area, a light emitting diode package has a large size as compared with the light emitting diode chips, thereby improving yield in manufacture and replacement of a display apparatus.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display apparatus, comprising:
    preparing a first manufacturing substrate having a plurality of light emitting diode chips coupled thereto;
    preparing a second manufacturing substrate having at least two pairs of conductive portions;
    transferring a first portion of the plurality of light emitting diode chips from the first manufacturing substrate to the second manufacturing substrate by moving the first manufacturing substrate downward towards the second manufacturing substrate; and
    moving the first manufacturing substrate having at least one remaining light emitting diode chip upward,
    wherein the transferring comprises the first portion of the plurality of light emitting diode chips being compressed downwards by the first manufacturing substrate to be bonded to the second manufacturing substrate,
    wherein preparing a first manufacturing substrate comprises providing the plurality of light emitting diode chips having a light emitting structure, an n-type electrode disposed on an n-type semiconductor layer of the light emitting structure, and a p-type electrode disposed on a p-type semiconductor layer of the light emitting structure,
    wherein preparing a first manufacturing substrate comprises providing the plurality of light emitting diode chips with an encapsulant disposed on an upper portion of the light emitting structure to cover the n-type electrode and the p-type electrode,
    wherein a n-type bump and a p-type bump are disposed to cover a portion of an upper surface of the encapsulant,
    wherein the n-type bump is electrically connected to the n-type electrode and the p-type bump is electrically connected to the p-type electrode through via-holes passing through the encapsulant,
    wherein the n-type bump and the p-type bump are spaced apart from each other on the upper surface of the encapsulant,
    wherein a width of the encapsulant is the same as a width of the light emitting diode chips.

* * * * *